United States Patent [19]

Yee

[11] Patent Number: 5,550,843
[45] Date of Patent: Aug. 27, 1996

[54] PROGRAMMABLE SCAN CHAIN TESTING STRUCTURE AND METHOD

[75] Inventor: Wilson K. Yee, Tracy, Calif.

[73] Assignee: Xilinx, Inc., San Jose, Calif.

[21] Appl. No.: 223,083

[22] Filed: Apr. 1, 1994

[51] Int. Cl.[6] .................................................. G01R 31/317
[52] U.S. Cl. .................. 371/22.3; 371/22.2; 364/488; 364/489; 364/490; 364/491
[58] Field of Search ............. 371/22.1–.3; 364/489–491, 364/488, 784; 395/800; 326/16, 37–39, 41, 45, 86, 101; 365/189.01–.03, 94, 95, 203; 340/825.83

[56] References Cited

U.S. PATENT DOCUMENTS

| | | | |
|---|---|---|---|
| Re. 34,363 | 8/1993 | Freeman | 307/465 |
| 4,124,899 | 11/1978 | Birkner et al. | 364/716 |
| 4,706,216 | 11/1987 | Carter | 365/94 |
| 4,750,155 | 6/1988 | Hsieh | 365/203 |
| 4,758,745 | 7/1988 | Elgamal et al. | 307/465 |
| 4,821,233 | 4/1989 | Hsieh | 365/203 |
| 4,870,302 | 9/1989 | Freeman | 307/465 |
| 4,931,671 | 6/1990 | Agrawal | 340/825.83 |
| 5,148,390 | 9/1992 | Hsieh | 365/95 |
| 5,198,705 | 3/1993 | Galbraith et al. | 307/465 |
| 5,221,865 | 6/1993 | Phillips et al. | 326/86 |
| 5,243,238 | 9/1993 | Kean | 307/465 |
| 5,258,668 | 11/1993 | Cliff | 307/465 |
| 5,260,611 | 11/1993 | Cliff | 307/465 |
| 5,260,881 | 11/1993 | Agrawal et al. | 364/489 |
| 5,267,187 | 11/1993 | Hsieh | 364/784 |
| 5,280,202 | 1/1994 | Chan | 307/465 |
| 5,341,044 | 8/1994 | Ahanin et al. | 340/825.83 |
| 5,347,519 | 9/1994 | Cooke et al. | 371/22.2 |
| 5,376,844 | 12/1994 | Pedersen et al. | 326/39 |
| 5,384,499 | 1/1995 | Pedersen et al. | 326/16 |
| 5,394,031 | 2/1995 | Britton et al. | 326/37 |
| 5,394,034 | 2/1995 | Becher et al. | 326/39 |

FOREIGN PATENT DOCUMENTS

WO93/05577  8/1992  WIPO.

OTHER PUBLICATIONS

Xilinx, Inc, The Programmable Logic Data Book, 1993, pp. 1—1 through 1–7; 2–1 through 2–42; 2–97 through 2–130; and 2–177 through 2–204, available from Xilinx, Inc., 2100 Logic Drive, San Jose, California 95124.

Xilinx Programmable Gate Array Data Book, 1989, pp. 6–30 through 6–44, available from Xilinx, Inc., 2100 Logic Drive, San Jose, California 95124.

Morales, Luis, "Boundary Scan in XC4000 Devices", XAPP 017.001, Oct. 1992, pp. 2–108 and 2–180.

*Primary Examiner*—James P. Trammell
*Assistant Examiner*—Hal D. Wachsman
*Attorney, Agent, or Firm*—Edel M. Young

[57] ABSTRACT

A circuit and method for testing Field Programmable Gate Arrays (FPGAs) comprises a programmable multiplexer for sequentially connecting columns of logic cells to enable the configuring of logic cell columns into one or more scan chains. Each column of logic cells contains an edge cell comprising a multi-input multiplexer, one of the multiplexer inputs being dedicated to receiving a signal from an adjacent cell, other of the inputs being connected to gate array input pads. A programmable control signal on the multiplexer enables the column to either receive test data from one of the gate array input pads or to connect as part of a scan chain by receiving a wrapping signal from the output logic cell of an adjacent column.

13 Claims, 9 Drawing Sheets

PROGRAMMABLE SCAN CHAIN TESTING STRUCTURE AND METHOD

RELATED APPLICATIONS

This application relates to the following concurrently filed and commonly assigned co-pending U.S. patent applications:

1. Ser. No. 08/222,138 invented by Danesh Tavana, Wilson K. Yee, and Victor A. Helen entitled "TILE BASED ARCHITECTURE FOR FPGA",
2. Ser. No. 08/221,679 invented by Danesh Tavana entitled "I/O INTERFACE CELL FOR USE WITH OPTIONAL PAD",
3. Ser. No. 08/223,391, now U.S. Pat. No. 5,453,706, issued Sep. 26, 1995 invented by Wilson K. Yee entitled "FIELD PROGRAMMABLE GATE ARRAY PROVIDING CONTENTION FREE CONFIGURATION AND RECONFIGURATION",
4. Ser. No. 08/223,247, now U.S. Pat. No. 5,430,687, issued Jul. 04, 1995 invented by Lawrence C. Hung entitled "A PROGRAMMABLE LOGIC DEVICE INCLUDING A PARALLEL INPUT DEVICE FOR LOADING MEMORY CELLS", and
5. Ser. No. 08/222,141 invented by Lawrence C. Hung entitled "A PROGRAMMABLE LOGIC DEVICE WITH PARTIALLY CONFIGURABLE MEMORY CELLS AND A METHOD FOR CONFIGURATION", all of which are incorporated herein by reference.

FIELD OF THE INVENTION

This invention relates generally to testing electronic integrated circuits, and more particularly to a circuit and method for testing field programmable gate arrays (FPGAs) utilizing programmable scan chains to improve test efficiency and effectiveness.

BACKGROUND OF THE INVENTION

Referring now to FIG. 1, a schematic diagram illustrates the physical layout and architecture of the field programmable gate array (FPGA) circuit discussed in patent application Ser. No. 08/222,138, entitled "TILE BASED ARCHITECTURE FOR FPGA", filed concurrently, in which the present invention may operate. This FPGA comprises logic elements, such as T11 and T12, which may be selectively programmed to implement a wide range of Boolean combinational and sequential operations. The advantage of the FPGA is that a prefabricated generalized circuit can be used to implement relatively complex digital functions without the need for designing and fabricating custom integrated circuits. The logic elements contain memory arrays which are used to store functional state tables. The logic elements connect to exterior pins of the integrated circuit package through bonding pads such as P1 through P10, which surround the periphery of the FPGA. These pads provide input and output signals to the FPGA, and provide a means for connecting power (VCC) and ground (GRID) to the circuit. The logic elements connect to the pads through an interface structure of input/output (I/O) edge cells such as IOI-1 through IOI-5. In the circuit shown in FIG. 1, each edge cell can be programmed to connect to adjacent edge cells and can be manufactured to connect to up to four bonding pads. In FIG. 1, pads P1, P2 and P3 are connected to input/output edge cell IOI-1. Pad P4 is connected to edge cell IOI-2. Because the edge cells are programmably connectable to each other, it is possible to connect any pad to its corresponding edge cell and through the interface structure to any one of a plurality of logic elements interior to the array. The interface structure allows for additional programmable wiring from one pad to another pad or from one logic element to another logic element.

One method of testing an FPGA is by transmitting test vector signals from a chosen pad through the logic elements to be tested to another pad (which thus serves for this purpose as an output pad). The .signals received at the output pad are read and compared to expected results to determine circuit functionality. The cost of testing an FPGA in this manner is potentially fifty percent of the cost of the device. The advent of smaller sized logic circuitry has allowed a greater number of circuit elements to be placed on a single die. However, the size of pads has not changed as dramatically. Thus, the maximum number of pads available on a die has increased only slowly while the number of logic cells in a logic array has greatly increased due to the reduction in size of the components. Electrical testing of dice having reduced sized circuitry is improved by implementing scan chains to sequentially test the increased quantity of logic cells.

In conventional die testing using scan chains, an input pad transmits incoming data to a top or bottom cell in a column of logic cells, which in turn shifts the data to the next cell, and so on through each cell in the column. The data are then output to an output pad and observed. In this configuration, a large number of pads is desirable for testing because the more pads that are available, the more entry ports there are for transmitting the test vector signals into the logic array or exit ports at which to observe the test results. One problem with testing state-of-the-art logic arrays is that the ratio of logic cells to input/output pads is becoming greater, due to the relative reduction in size of the logic circuitry compared to the size of the pads. This size reduction allows a greater number of logic cells to be placed on a single die, without a corresponding increase in the maximum number of pads that can fit on a die. There are fewer pads available for testing a given amount of logic circuitry and thus fewer entry and exit ports for testing.

In addition, FPGAs present a unique testing problem in that the same model of FPGA die can be placed in many different packages with different numbers of pins. In order to maximize testing speed for all packages, it is desirable to apply test signals to all test pins provided in the package. But some adaptation is needed to achieve complete testing when a package is used which has a small number of pins.

SUMMARY OF THE INVENTION

With the present invention, the testing is adaptable to quick and efficient processing of all I/O pads, the scan chain length is a function of the package size and number of pins, and the scan chain length is optimal for the given package configuration.

According to the present invention, a circuit and method for testing field programmable gate arrays (FPGAs) comprises a programmable multiplexer for sequentially connecting columns of logic cells to enable the configuring of logic cell columns into one or more scan chains. Each column of logic cells contains an edge cell comprising a multi-input multiplexer, at least one of the multiplexer input terminals being dedicated to receiving a signal from an adjacent cell, other of the input terminals being connected to gate array input pads. A programmable control signal to the multiplexer enables the column to either receive test data from one of the gate array input pads or to be connected as part of a scan chain by receiving a wrapping signal from the output logic cell of an adjacent column.

A scan enable signal, usually external, is common to all scan chains, and sets the FPGA to either an operating mode or a scan mode. The operating mode is the normal user mode of the FPGA. In operating mode, the scan enable signal is set to a logic low level, and user data applied to the pads which have been configured as input pads are transmitted to the FPGA logic for processing. Output signals are received at pads which have been configured as output pads. In scan mode, the scan enable signal is set high and the output multiplexers pass the test data through to the output pads where the test data can be read to determine whether the chip is functioning properly.

In one embodiment, each logic cell of an FPGA logic array includes one internal flip flop. Each column of logic cells comprises eight logic cells connected in series, and further includes one input into one end of the column and one output exiting from the opposite end of the column. The columns are selectively connected together to produce scan chains of serially linked cells. Test data are sequentially clocked into the scan chain through a series of flip flop cells and out of the scan chain to a package bonding pad.

In one configuration of the test structure, a single scan chain is formed by serially connecting all of the columns into a single discrete test structure. Test data are shifted in from the lower leftmost logic cell of the array, and up vertically through the first column of logic cells. At the top of the first column, the scan chain wraps from top to bottom and connects to the bottom-most logic cell of the second column. The test data are then scanned in vertically, up through the second column to the topmost logic cell of the second column. The scan chain again wraps and connects to the bottom-most logic cell of the third column. The scan chain routes through the array in this manner to connect all of the columns. At the end of the scan chain, test data are output through the topmost logic cell of the final column. Although the present invention is capable of providing a single scan chain through which test data are applied, more than one scan chain is typically formed in order to maximize efficiency and minimize test time.

In another configuration of the test structure, four scan chains are formed, each scan chain comprising two columns. In this configuration, data are applied to the scan chain through input terminals at the lower logic cell of the first, third, fifth and seventh columns. The test data are shifted vertically up the first column. At the topmost logic cell of the first, third, fifth and seventh columns, the scan chain wraps from top to bottom entering the bottom-most logic cell of the second, fourth, sixth and eighth columns, respectively. The scan chains continue vertically to the topmost cell of the second, fourth, sixth and eighth columns where the test data are clocked to a output signal pad. Four scan chains are generally preferred over one, because the testing function can be performed on four groups in parallel in approximately one-fourth the time.

Edge cells link the logic cell columns with the input and output pads of the FPGA. A bottom edge cell may connect to more than one input pad, a terminal for receiving a wrapping signal, an input multiplexer, a configuration memory cell, and a terminal for providing an output signal. The wrapping signal terminal and the input pads are connected to input terminals of the input multiplexer. One of the plurality of input pads receives a Test-In signal. The input multiplexer selects and propagates either the Test-In signal or the wrapping signal depending on the programmed state of the configuration memory cell, which controls the input multiplexer and is programmed to provide the optimal number of scan chains for the given FPGA. The selected test signal output from the multiplexer is scanned through the chosen column of logic cells. As the test signal reaches the topmost logic cell in the column, the test signal either wraps to the bottom edge of an adjacent column and becomes the wrapping signal for a successive input multiplexer, or is transmitted to an output multiplexer for export from the FPGA.

DETAILED DESCRIPTION OF THE PREFERRED EMBODIMENT

Figure 1:
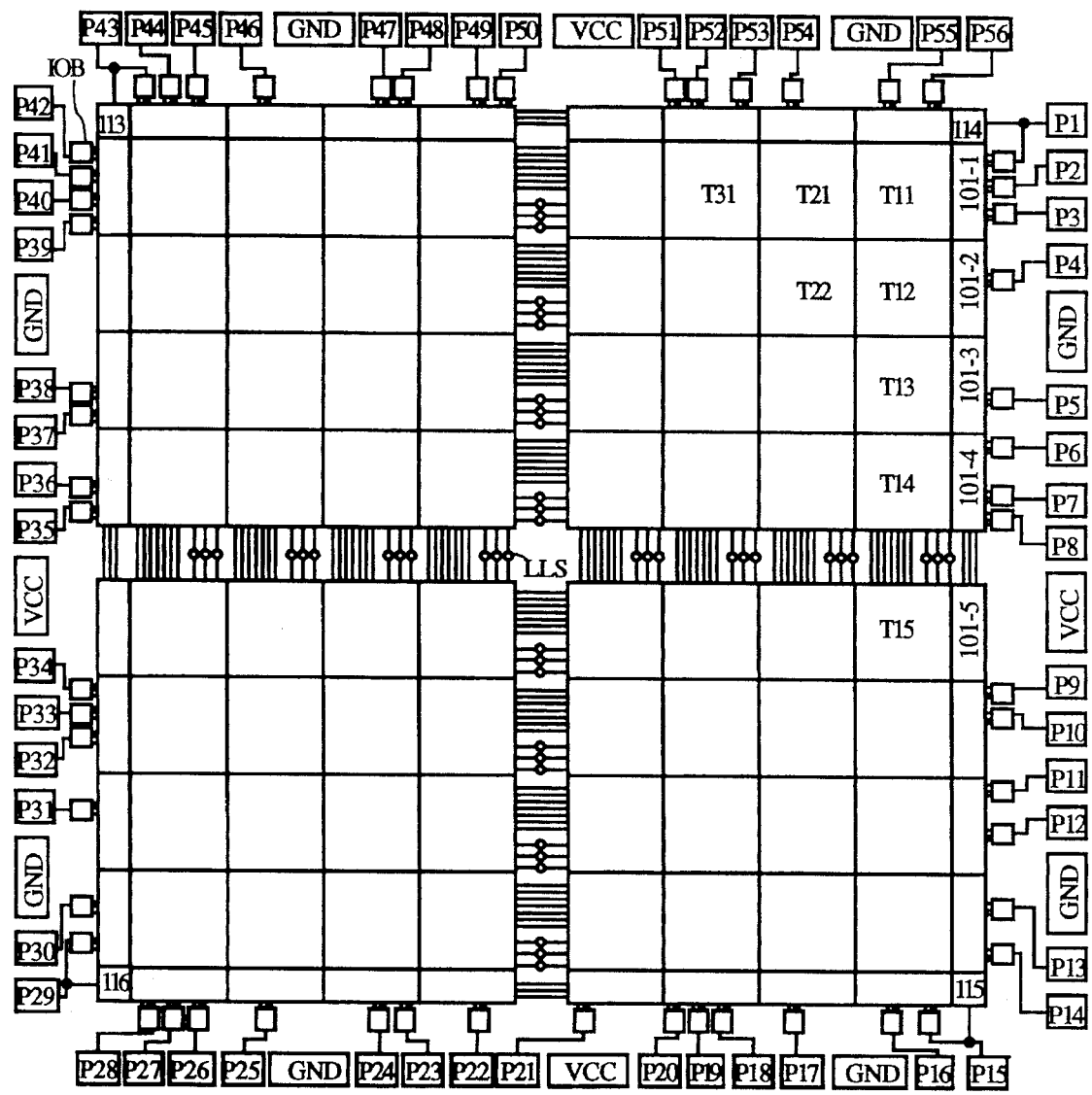
FIG. 1 is a schematic diagram of a Field Programmable Gate Array (FPGA) device.
Figure 2:
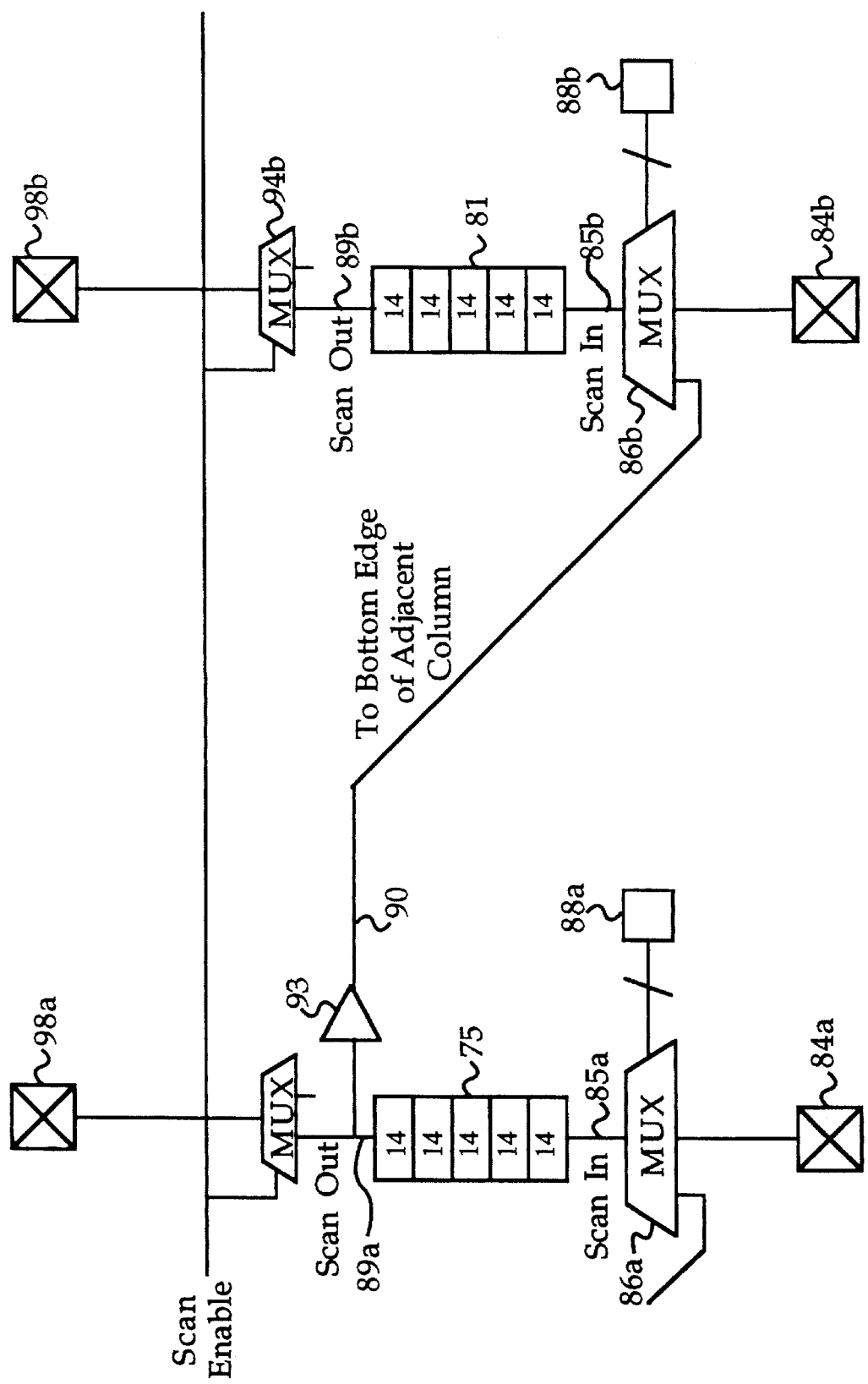
FIG. 2 is a detailed diagram of a two column scan chain showing the connections between two adjacent columns of logic cells.

Referring now to FIG. 2, a diagram of the scan chain selecting circuitry is shown which can be configured such that a selectable number of columns can be scan chained together. A scan chain is defined as a linking series of logic cells that are tested by sequentially shifting test data into an input edge cell and shifting the data through the series to an output edge cell. Two adjacent columns (75, 81) of logic cells 14 illustrate the use of multiplexers 86a, 86b to selectively join two columns (75, 81) into a single scan chain. An input multiplexer 86a is controlled by data stored in the configuration memory 88a to respond either to a test signal from a first input pad 84a or from a wrap-around signal from a column to the left. The configuration memory is programmed with the exact configuration of the scan chain, i.e. the optimal number of scan chains to be utilized for the given FPGA. The input multiplexer 86a transmits a Scan-In signal 85a to a column 75 of logic cells 14. Each logic cell 14 is comprised of a conventional flip flop 24, an FPGA logic block 26, a scan-in bypass 28 and a multiplexer 30 as described with respect to FIG. 4A below.

In the scan mode, the scan-in signal 85*a* sequentially shifts test data through the plurality of logic cells 14 comprising the column 75. The test signal exits the top logic cell 14 as a Scan Out signal. The Scan-Out signal may be buffered by signal driver 93, and is placed onto wrapping signal line 90 which is used to transmit the buffered Scan-Out signal from the top of the first column 75 to the input multiplexer 86*b* of the second column 81. Signal driver 93 enables the Scan-Out signal 89 to be driven to wrapping signal line 90 in the top-to-bottom wrapping scheme used to produce extended scan chains. When input multiplexer 86*b* is set by memory cell 88*b* to propagate the signal from wrapping signal line 90, the adjacent first and second columns (75, 81) form a single two column scan chain for the purposes of testing the functionality of the two columns. Input multiplexer 86*b* selects and propagates the signal on wrapping signal line 90 to produce Scan-In signal 85*b*. Again, Scan-In signal 85*b* is shifted vertically up through column 81. A Scan-Out signal 89*b* carries the output data from column 81. Output multiplexer 94*b* selects Scan-Out signal 89*b* as an input based on a "high" logic level from the Scan Enable signal. Scan-Out signal 89*b*, transmitted through output multiplexer 94*b*, exits the FPGA 10 through output pad 98*b*. Note that input pad 84*b* and output pad 98*a* are not utilized in this two-column scan chain configuration of columns 75 and 81. Thus, such a two column configuration would be used with a package which does not have pins connected to pads 84*b* and 98*a*. For a package configuration having pins at pads 84*b* and 98*a*, memory cell 88*b* can be loaded to cause multiplexer 86*b* not to select wrapping signal line 90 but instead to select the signal from pad 84*b*. In scan mode, multiplexer 94*a* places the Scan Out signal from line 89*a* onto pad 98*a*.

Figure 3A:
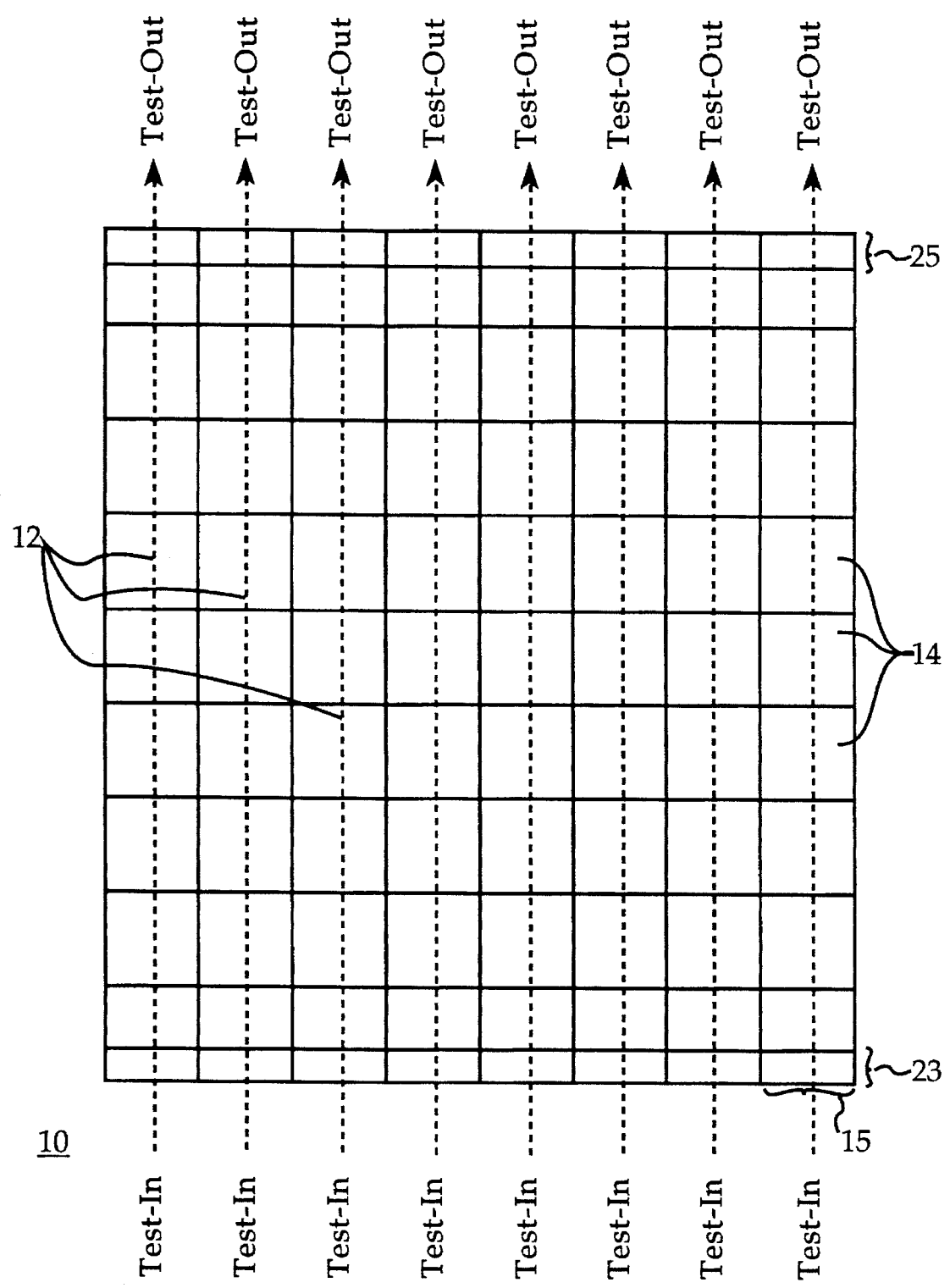
FIG. 3A is a diagram of an 8×8 logic array having eight scan chains illustrating a ratio of one scan chain per column for testing in accordance with the present invention.
Figure 3B:
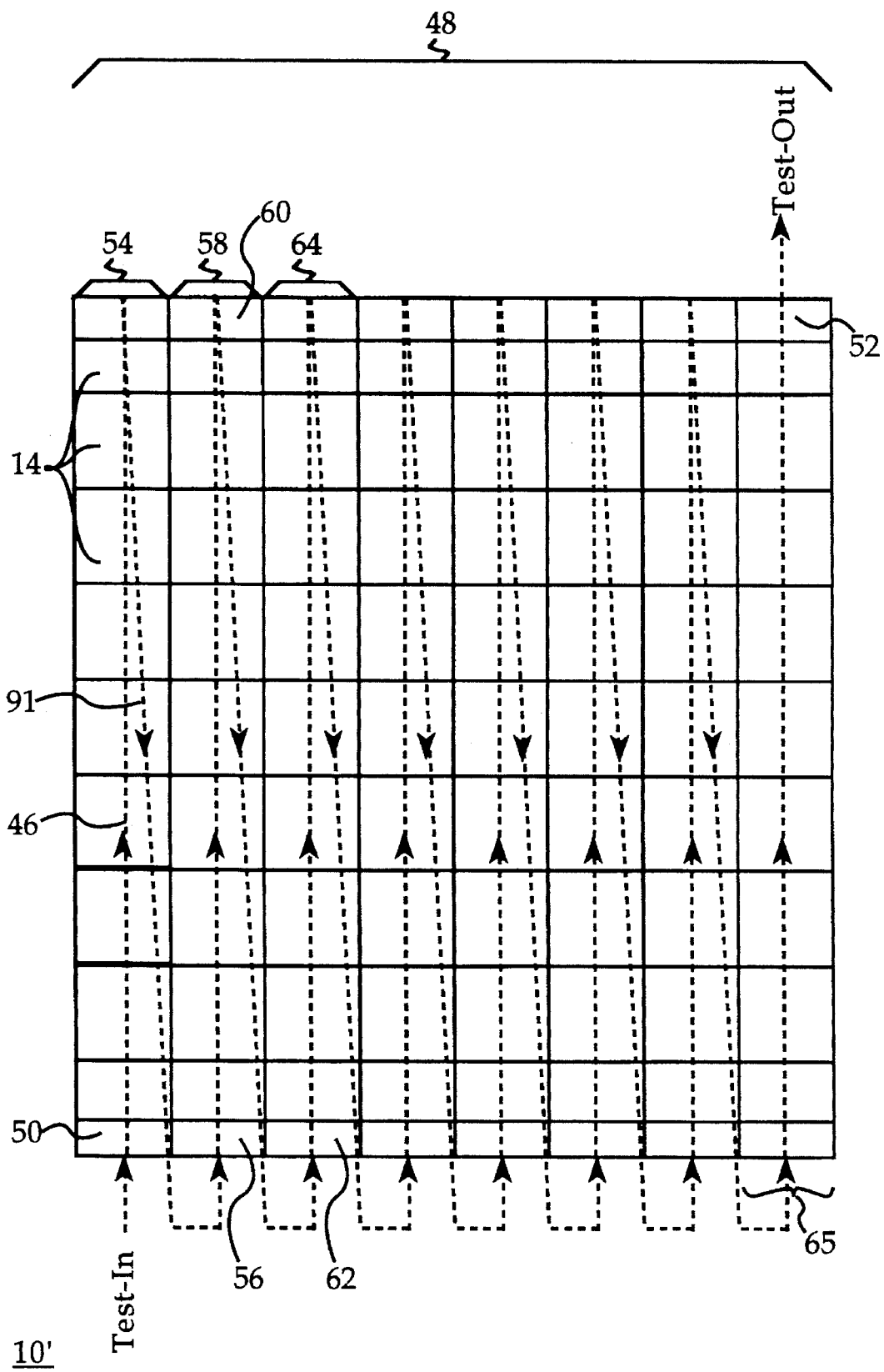
FIG. 3B is a diagram of an 8×8 logic array programmed to have a single scan chain for FPGA testing.
Figure 3C:
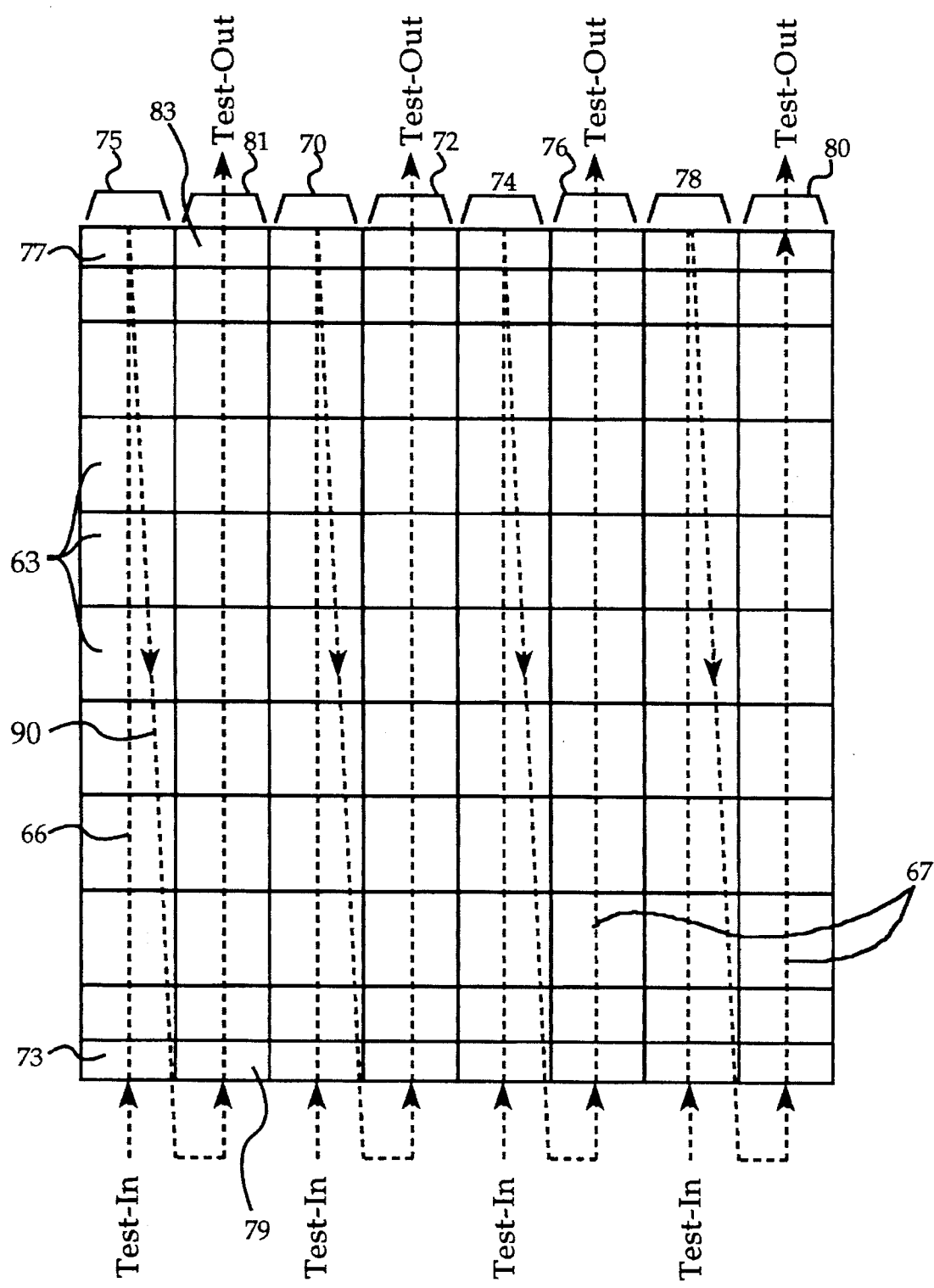
FIG. 3C is a diagram of an 8×8 logic array programmed to have four scan chains, in which each scan chain comprises two columns.

FIGS. 3A, 3B, and 3C show three scan chain configurations achievable in an 8×8 array with the circuit of FIG. 2. As configured in FIG. 3A, the 8×8 logic array 10 includes eight scan chains 12, one scan chain per column 15 of logic cells 14. Where the FPGA package contains sufficient Input/Output (I/O) pins (not shown), one scan chain 12 per column 15, as is achieved in the 8×8 logic array 10, provides an efficient overall test time. The fastest test time is achieved where every available I/O pin is used during testing to accommodate a scan chain 12, and all columns are scanned at the same time.

Test data enter each scan chain 12 as a Test-In signal through a bottom edge cell 23 and are shifted vertically through the scan chain to a top edge cell 25. From the top edge cells 25, the Test-Out signals are exported to output pads (not shown).

Referring now to FIG. 3B, a diagram of an alternative configuration of the present invention is illustrated, in which the 8×8 logic array 10' comprises a single scan chain 46. The columns 48 of the array are interconnected by a single scan chain 46 that begins at the lower left edge cell 50 of the array 10', and ends at the upper right edge cell 52 of the array 10'. The test data serially passes through flip flops 24 (FIG. 4A) within the scan chain 46 between the Test-In and Test-Out signals.

Test-In signals are input and shifted vertically up through the first column 54 of logic cells 14. At the top of the first column 54, the scan chain 12 connects through wrapping signal line 90 from top to bottom, and connects to the bottom-most edge cell 56 of the second column 58. The test signals are then again shifted vertically up through the second column 58 to the topmost edge cell 60 of the second column 58. The scan chain 46 again wraps from top to bottom and connects to the bottom-most edge cell 62 of the third column 64. The scan chain 46 routes through the array 10' connecting all of the columns 48 in a top-to-bottom manner as described with respect to the first through third columns 54, 58 and 64. At the topmost edge cell 52 of the final column 65, the test signals are output through a Test-Out terminal. Although this alternative configuration is capable of providing a single scan chain 46 through which test data are passed, typically more than one scan chain is used in an effort to maximize efficiency and minimize test time.

Referring now to FIG. 3C, a diagram of another alternative configuration is illustrated in which an 8×8 logic array 10" has four scan chains 67. As there are eight columns 75, 81, 70, 72, 74, 76, 78 and 80 in the logic cell array 10", two columns will be chained together to comprise four scan chains 67 for testing purposes. In the first scan chain, the test data are input as a Test-In signal at edge cell 73 at the lower left corner of logic array 10". The test data are shifted through a first scan chain 66, vertically up the column 75 through each logic cell 14. At the topmost edge cell 77 of the first column 75 the first scan chain 66 traverses from top to bottom via wrapping signal line 90 and scans in at the bottom-most edge cell 79 of the second column 81. The first scan chain 66 continues vertically to the topmost edge cell 83 of the second column 81 where the test data are output as a Test-Out signal. Likewise, columns 70 and 72 are chained together, columns 74 and 76 are chained together and columns 78 and 80 are chained together and tested in the same manner. When sufficient pins are available in the package, four scan chains are preferred over one scan chain because the testing function can be performed in parallel, and therefore the testing can be performed more quickly.

Figure 4A:
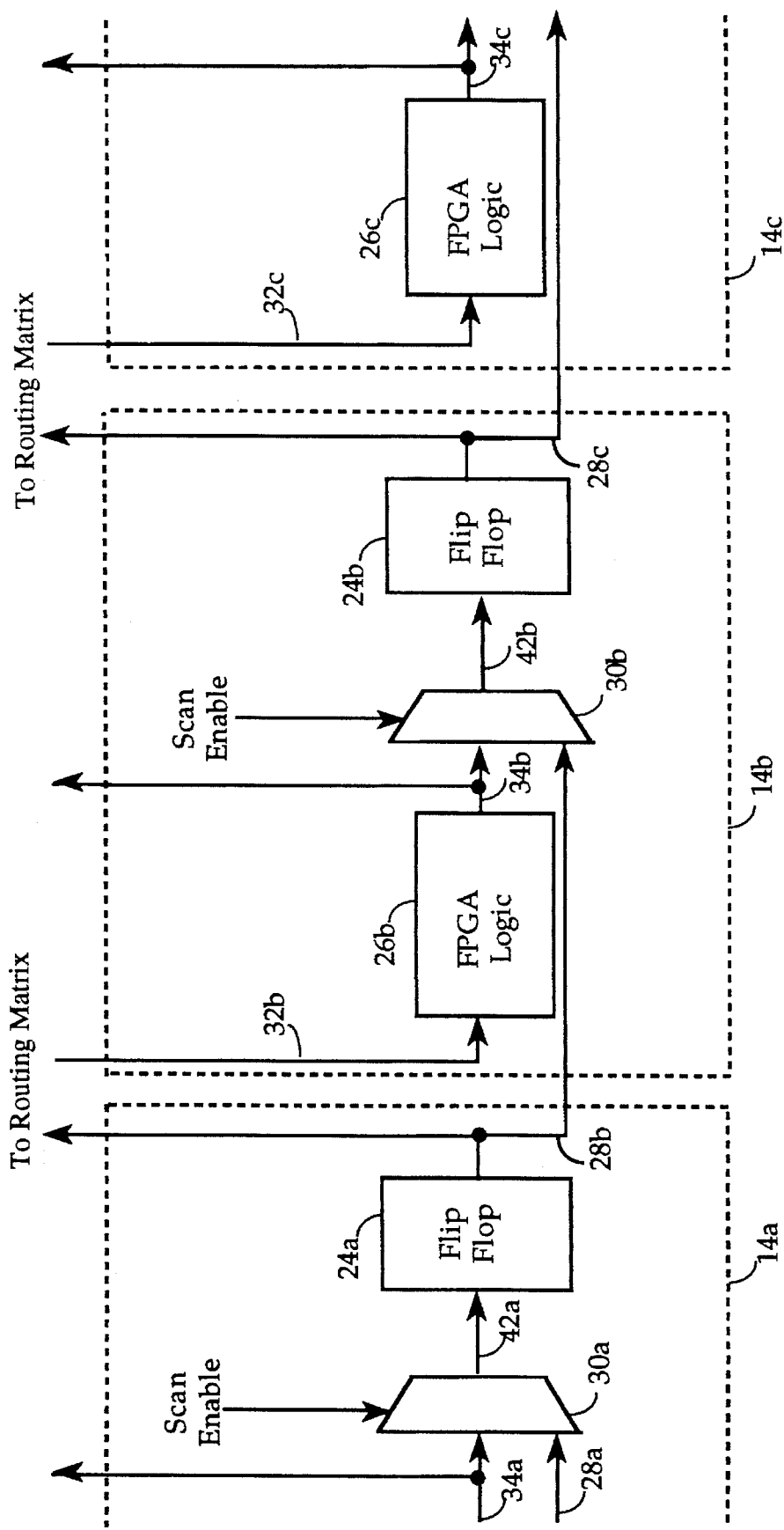
FIG. 4A is a schematic diagram of part of a logic cell in the FPGA of FIG. 2.

Referring now to FIG. 4A, a schematic diagram is shown of several logic cells 14*a*–14*c* representing logic cells 14 of FIG. 2. The content of a logic cell 14 (FIG. 2) is exemplified by cell 14*b* (FIG. 4A) which comprises an FPGA logic block 26*b*, a multiplexer 30*b*, and a conventional flip flop 24*b*. Multiplexer 30*b* receives input signals from FPGA logic block 26*b* and from flip flop 24*a* of the previous logic cell 14*a*. As controlled by the Scan Enable signal, multiplexer 30*b* passes one of these signals to flip flop 24*b*. A logic array can function in a scan test mode or an operating mode. In normal use of the FPGA, the logic array functions in an operating mode. In operating mode, logic blocks 26*a*–26*c* receive incoming data signals from the Routing Matrix and calculate digital logic functions. The logic functions may be look-up tables stored in logic blocks 26*a*–26*c*. In scan mode, the mode with which the present invention is predominantly concerned, data are sequentially clocked through the plurality of logic cells 14 in order to quickly and efficiently test the functionality of the array. A global Scan Enable signal instructs the various logic cells 14 as to the current operating mode of the logic array. The Scan Enable signal selects the scan mode when high and the operating mode when low.

The flip flop 24*a* outputs a first signal 28*b* which goes both to the Routing Matrix and to multiplexer 30*b* in logic block 26*b*. In operating mode, Scan Enable multiplexers 30*a*, 30*b*, and 30*c* do not receive and forward flip flop output signals from the previous logic block, but rather receive logic input signals from the FPGA logic blocks. In scan mode, multiplexers 30*a*, 30*b*, and 30*c* receive the Scan-Out signals from flip flops in the previous logic block, and thus form a scan chain through the column of cells such as 14*a*, 14*b*, and 14*c*. The multiplexing is controlled by the Scan Enable signal. Multiplexer 30*b* in logic cell 14*b* outputs a corresponding scan output signal 42*b* to flip flop 24*b*. Each logic cell 14 in the logic array preferably comprises the same elements as the logic cell 14b, and is connected in the manner of the logic cell 14b.

Figure 4B:
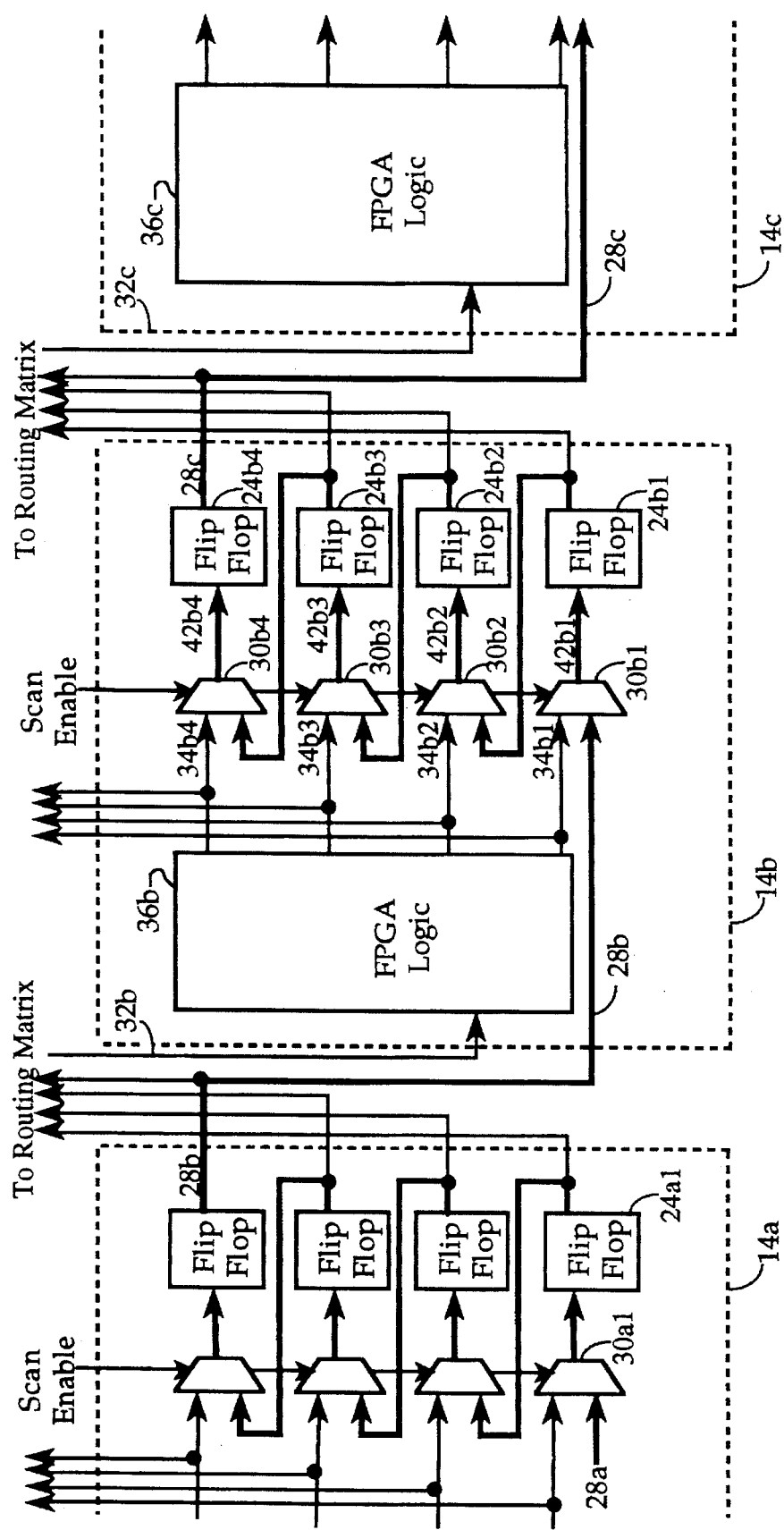
FIG. 4B shows part of a logic cell in another embodiment of an FPGA.

Referring to FIG. 4B, an embodiment of the invention is shown in which each logic block includes four multiplexers and four flip flops. In scan mode, the four flip flops of one logic block are connected into a single scan chain, as illustrated by the emphasized lines in the figure. For example scan-in line 28b provides input to multiplexer 30b1, and is applied to line 42b1. Flip flop 24b1 takes this signal and on the next clock cycle, applies this signal to the lower input of multiplexer 30b2. Multiplexer 30b2, being controlled by Scan Enable signal, applies this signal to line 42b2. At the next clock cycle, flip flop 24b2 applies this signal to multiplexer 30b3. After the fourth clock cycle, the signal is output on scan-out line 28c where it is further propagated by multiplexers (not shown) in the next logic block 14c. Clearly, from the above description, other embodiments can be derived which allow a circuit designer to select different lengths of scan chains for different kinds of testing, different package types, and different chip architectures.

Figure 5A:
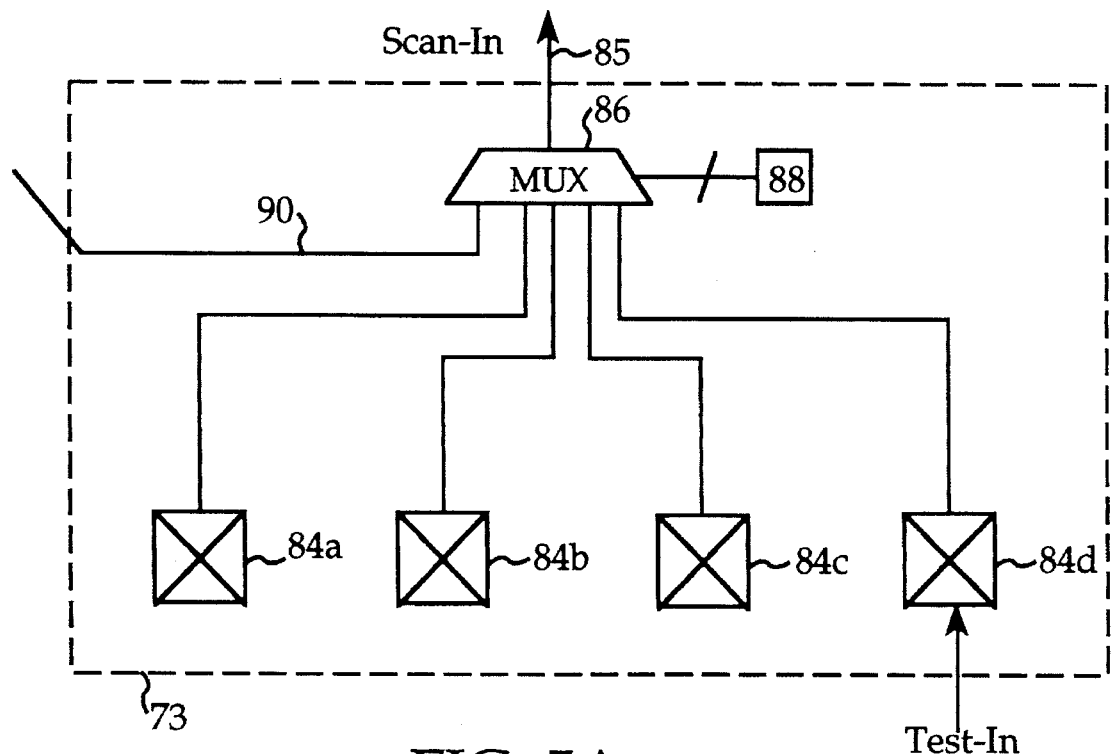
FIG. 5A is a schematic diagram of a bottom edge cell of the present invention illustrating connection and signal routing details.

Referring now to FIG. 5A, one embodiment of the bottom edge multiplexers 86a and 86b from FIG. 2 is shown, comprising four input pads 84a–84d, an input multiplexer 86, a three-cell configuration memory 88 and a wrapping signal line 90. The wrapping signal line 90 and the four input pads 84a–84d are connected as inputs to the input multiplexer 86. One of the four input pads 84a–84d can be connected to receive an external Test-In signal. Multiplexer 86 selects an output from among the four input pads 84a–84d and the wrapping signal line 90. The wrapping signal line 90 connects the multiplexer 86 with the output of the preceding column, enabling top to bottom wrapping to form scan chains as discussed above with respect to FIG. 2. Multiplexing is controlled by three bits of data stored in configuration memory 88. Using the configuration memory cells 88, the logic array can be selectively programmed to realize the various scan chain configurations of FIG. 2, FIG. 4 and FIG. 5, and other configurations which are equivalently available.

Figure 5B:
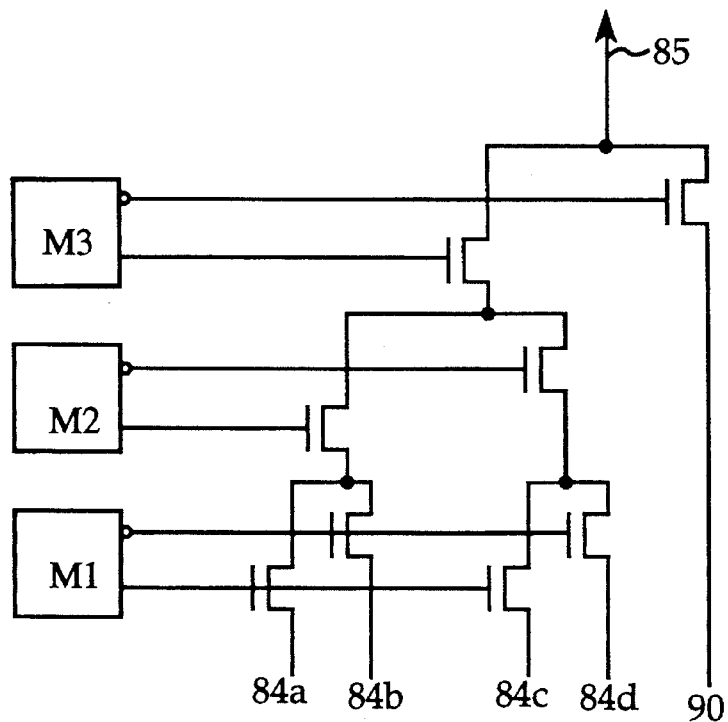
FIG. 5B shows one multiplexer circuit diagram for the multiplexer of FIG. 5A.

FIG. 5B shows one embodiment of multiplexer 86 of FIG. 5A. Memory cells M1 and M2 in memory 88 select one of pads 84a–84d. Memory cell M3 selects between the selected pad signal and the signal on wrapping line 90 to place onto output line 85.

Figure 6A:
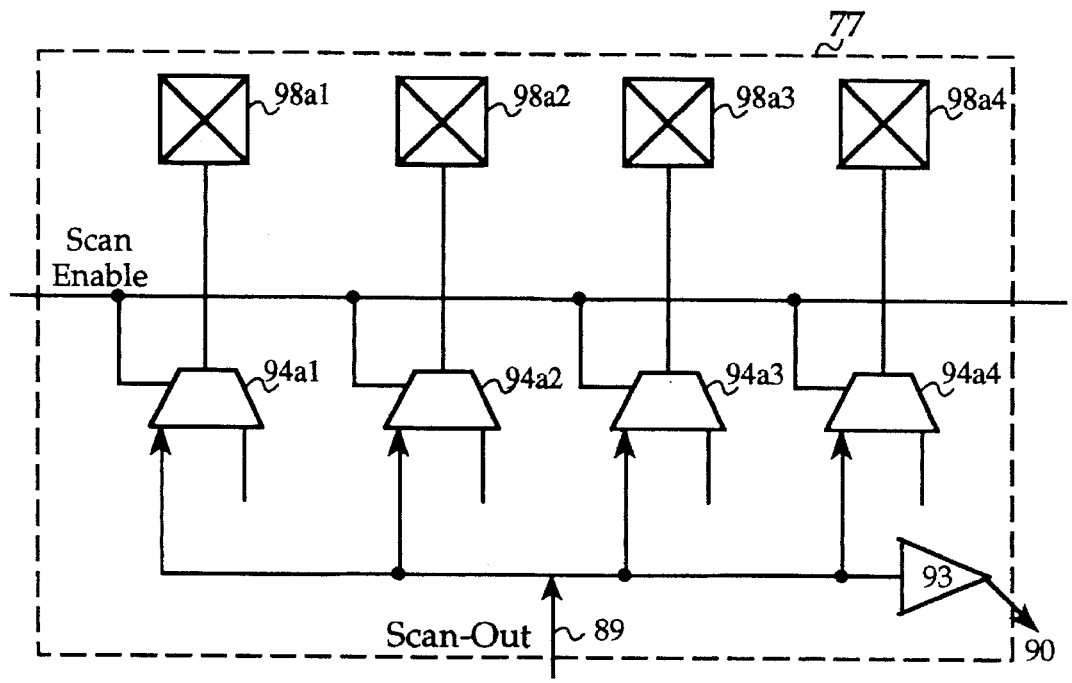
FIG. 6A is a schematic of a top edge cell of the present invention illustrating connection and signal routing details.

Referring now to FIG. 6A, details of the top edge multiplexer 94a and 94b of FIG. 2 are shown. The structure represented by multiplexer 94a in FIG. 2 may comprise a plurality of output multiplexers 94a-1, 94a-2, 94a-3, and 94a-4, each of which is controlled by a line for the Scan Enable signal (this Scan Enable signal is discussed with reference to FIG. 6B). The Scan-Out signal 89 is sent to as many pads as possible to improve the chance that one of the pads will be bonded out to a package pin. Each multiplexer receives at one of its input terminals the Scan Out signal from line 89a (FIG. 2). At the other input terminal, each multiplexer receives logic generated by a user during normal operation of the chip (in operation mode). Multiplexers 94a-1, 94a-2, 94a-3, and 94a-4 provide output signals to pads 98a-1 through 98a-4 respectively, as shown. To provide the wrapping signal on line 90, the Scan Out signal on line 89 is applied to a signal driver 93. Output multiplexer 94 is the terminating multiplexer in a chain of logic cells 14. The scan-out signal of FIG. 6A represents the last signal received from the scan-in bypass 28 of FIG. 4A or FIG. 4B.

The Scan Enable signal of FIG. 6A is a global signal, common to all scan chains 12, and can be set to an operating mode or a scan mode. The Scan Enable signal is set to low when the FPGA is in the operating mode. The Scan Enable is set to high when the FPGA is in the scan mode. When the Scan Enable signal of FIG. 6A is high, the FPGA is functioning in the scan mode, and the Scan-Out signal 89 is selected and propagated by multiplexers 94 to the pads 98. When the Scan Enable signal is low, the FPGA is functioning in the operating mode in which pads 98 send or receive signals from internal logic which drives the other terminal of multiplexers 94, and the scan chain function is disabled.

In an embodiment not shown but discussed in co-pending application Ser. No. 08/222,138 pads equivalent to pads 98a1–98a4 can also provide input signals.

Figure 6B:
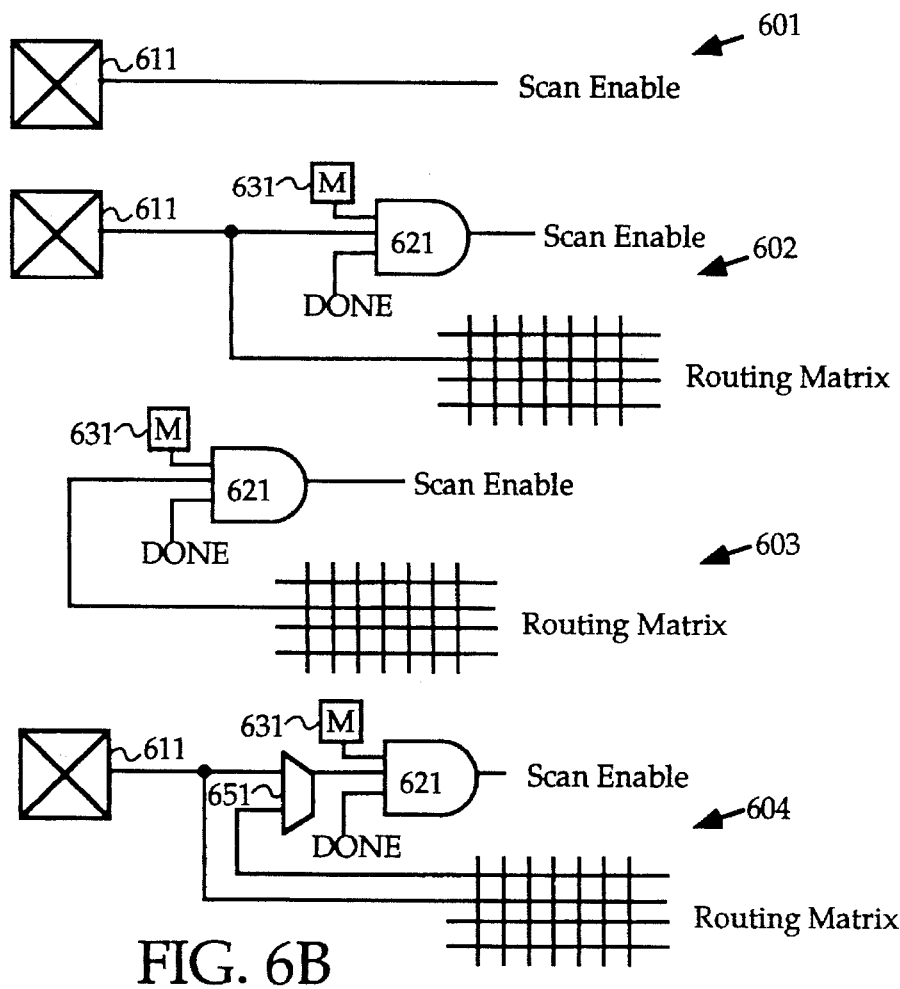
FIG. 6B shows several structures for supplying the Scan Enable signal.

FIG. 6B shows four structures which can provide the Scan Enable signal. As illustrated by structure 601, the Scan Enable signal may simply be taken from a dedicated pad to which a corresponding external pin is always connected.

As illustrated by structure 602, a pin need not be dedicated to the scan function but may also be used for other purposes. Three-input AND gate 621 receives input signals from pad 611, a configuration memory cell 631, and a DONE signal which indicates configuration is complete. If memory cell 631 is loaded with a high signal and the DONE signal is high, AND gate 621 provide the Scan Enable signal from pad 611. If memory cell 631 is loaded with a low signal, AND gate 621 does not provide a Scan Enable signal, and pad 611 can be used by the user to access internal logic through the Routing Matrix.

As illustrated by structure 603, AND gate 621 can take the Scan Enable signal from the internal routing matrix rather than an external pin when memory cell 631 activates the scan mode with a high signal.

Finally, as illustrated by structure 604, a multiplexer 651 controlled by memory cell 652 can select between the two options provided in structures 602 and 603. As discussed above, a high signal in memory cell 631 places the device into scan mode so that a Scan Enable signal will be provided. The Scan Enable signal can then be taken from pad 611 which is connected to an external pin or from the internal routing matrix 640. When memory cell 631 is low, the device is in operating mode so that no Scan Enable signal will be generated. In operating mode, pad 611 can be used as an I/O pad by a user, sending or receiving signals from the routing matrix 640.

The invention has now been explained with reference to specific embodiments. Other embodiments will be apparent to those of ordinary skill in the art in light of this disclosure. For example, whereas FIG. 2 shows a single signal propagating through a column and to the next column, in another embodiment each column can propagate a plurality of signals and the single wrapping signal line 90 can be replaced with a plurality of lines. While FIG. 2 shows multiplexers 86 as receiving a wrapping signal line 90 from a column to the left, in another embodiment, wrapping signals may be available from both the right and the left or from columns not adjacent. Further, an architecture may be provided in which the length and width of scan chains are configurable. For example a signal applied to a pad at the bottom of a column may enter the column midway rather than at the bottom and another signal may exit the column midway and enter the adjacent column at the bottom. A variety of other logic elements and functions can be equivalently used to implement the scan chain testing process. It will also be obvious that although the circuit and method of the embodiments described are applied in an exemplary manner to FPGAs, the present invention is equivalently applicable to and intended to include a wide range of logic circuit applications requiring testing using digital test data. Therefore, it is not intended that this invention be limited to FPGAs or otherwise limited, except as indicated by the appended claims.

I claim:

1. A circuit for the scan chain testing of logic cells, the circuit comprising:

a first column of logic cells having a first column input terminal for receiving test data and a first column output terminal for outputting test data;

a second column of logic cells having a second column input terminal for receiving test data and a second column output terminal for outputting test data; and a first multiplexer having;
 a first multiplexer output terminal coupled to the second column input terminal,
 a plurality of first multiplexer input terminals, one first multiplexer input terminal of which is coupled to the first column output terminal, and
 a control terminal for selecting from among the first multiplexer input terminals for propagation of a selected input signal to the first multiplexer output terminal.

2. The circuit according to claim 1 wherein the coupling between the first column output terminal and a first multiplexer input terminal comprises a signal driver.

3. The circuit according to claim 1 wherein each logic cell further comprises:

an FPGA logic block having an input terminal for receiving cell input data and an output terminal for outputting FPGA logic data; and a cell multiplexer having a control terminal, an output terminal, a first input terminal for receiving the cell input data and a second input terminal coupled to the FPGA output terminal for receiving the FPGA logic data, wherein the cell multiplexer propagates the cell input data in response to an indication on the control terminal that the logic cell is undergoing testing.

4. The circuit according to claim 3, further comprising a flip flop having an input terminal coupled to the cell multiplexer output terminal and having an output terminal.

5. The circuit according to claim 4, wherein the columns of logic cells comprise a plurality of logic cells connected in series such that the output terminal from the flip flop of a first logic cell is coupled to the FPGA logic block input terminal of a second logic cell, the cell input data to the second logic cell being provided by the flip flop of the first logic cell.

6. The circuit according to claim 1 wherein the input terminal of the first column is further coupled to an output terminal of a second multiplexer, the second multiplexer having a control terminal for selecting from among second multiplexer signals for propagation to the input terminal of the first column, a first input terminal for receiving test data from an input pad and a second input terminal for receiving test data from the output terminal of a third column of logic cells.

7. The circuit according to claim 1, wherein the output terminal of the second column of logic cells is connected to an input terminal of a second multiplexer, the output terminal of the second multiplexer forming the input terminal to a third column of logic cells, the second multiplexer being programmable to add the third column of logic cells to the scan chain formed by the first and second columns.

8. A circuit for the scan chain testing of logic cells as in claim 1 in which the circuit is formed on an integrated circuit chip, and the first multiplexer has another first multiplexer input terminal which is coupled to a pad on the integrated circuit chip.

9. A method for the scan chain testing of logic cells in a circuit comprising a plurality of columns of serially linked logic cells, the method comprising the steps of:

outputting test data from a first column of logic cells;

inputting the test data to a multiplexer having a plurality of input terminals, one input terminal of which is coupled to an output terminal of the first column, and having a controller for selecting from among the plurality of multiplexer input terminals for propagation of a selected input signal to a multiplexer output terminal;

signaling the controller to select the test data for propagation to the multiplexer output terminal; and propagating the test data from the multiplexer output terminal to a second column of logic cells.

10. The method according to claim 9 further comprising a first step of inputting test data into the first column of logic cells.

11. The method according to claim 9 wherein the step of outputting test data from a first column of logic cells utilizes a wrapping signal line to transmit test data from the output terminal of the first column to one input terminal of the multiplexer.

12. The method according to claim 11 wherein the wrapping signal line includes a signal driver.

13. The method according to claim 9 wherein the controller is programmably signaled.

* * * * *